United States Patent [19]

Plus et al.

[11] Patent Number: 5,224,102
[45] Date of Patent: Jun. 29, 1993

[54] DESIGN AND TEST METHODOLOGY FOR REDUNDANT SHIFT REGISTERS

[75] Inventors: Dora Plus, South Bound Brook, N.J.; Antoine P. DuPont, Villingen, Fed. Rep. of Germany

[73] Assignee: Thomson. S.A., Courbevoie, France

[21] Appl. No.: 660,273

[22] Filed: Feb. 28, 1991

[51] Int. Cl.$^5$ ............................................. G01R 31/28
[52] U.S. Cl. ................................. 371/21.1; 371/22.6
[58] Field of Search ................... 371/21.1, 22.5, 22.6, 371/27, 8.1, 10.3; 324/158 R; 365/201

[56] References Cited

U.S. PATENT DOCUMENTS

| | | | |
|---|---|---|---|
| 4,633,242 | 12/1986 | Sekiya | 340/719 |
| 4,782,340 | 11/1988 | Czubatyj et al. | 340/765 |
| 4,926,425 | 5/1990 | Hedtke et al. | 371/22.6 |

Primary Examiner—Vincent P. Canney
Attorney, Agent, or Firm—J. S. Tripoli; D. H. Irlbeck; L. L. Hallacher

[57] ABSTRACT

A display device having a plurality of select lines includes redundant select line scanners. Each scanner includes a plurality of substantially identical stages having an input terminal and an output terminal. The stages and select lines are ordinally numbered and correspondingly numbered stages are connected to opposite ends of the correspondingly numbered select lines by separate line segments. The stages within each scanner are cascaded by connecting the output terminal of each stage to the input terminal of the immediately succeeding stage. The select line scanners are independently operable by the provision separate power supplies and clock generators. During testing, one scanner is made to look like a high impedance to the scanner being tested. Failed stages of a scanner are replaced by the correspondingly numbered stage of the other scanner simply by opening the separate line segment of the failed stage.

2 Claims, 2 Drawing Sheets

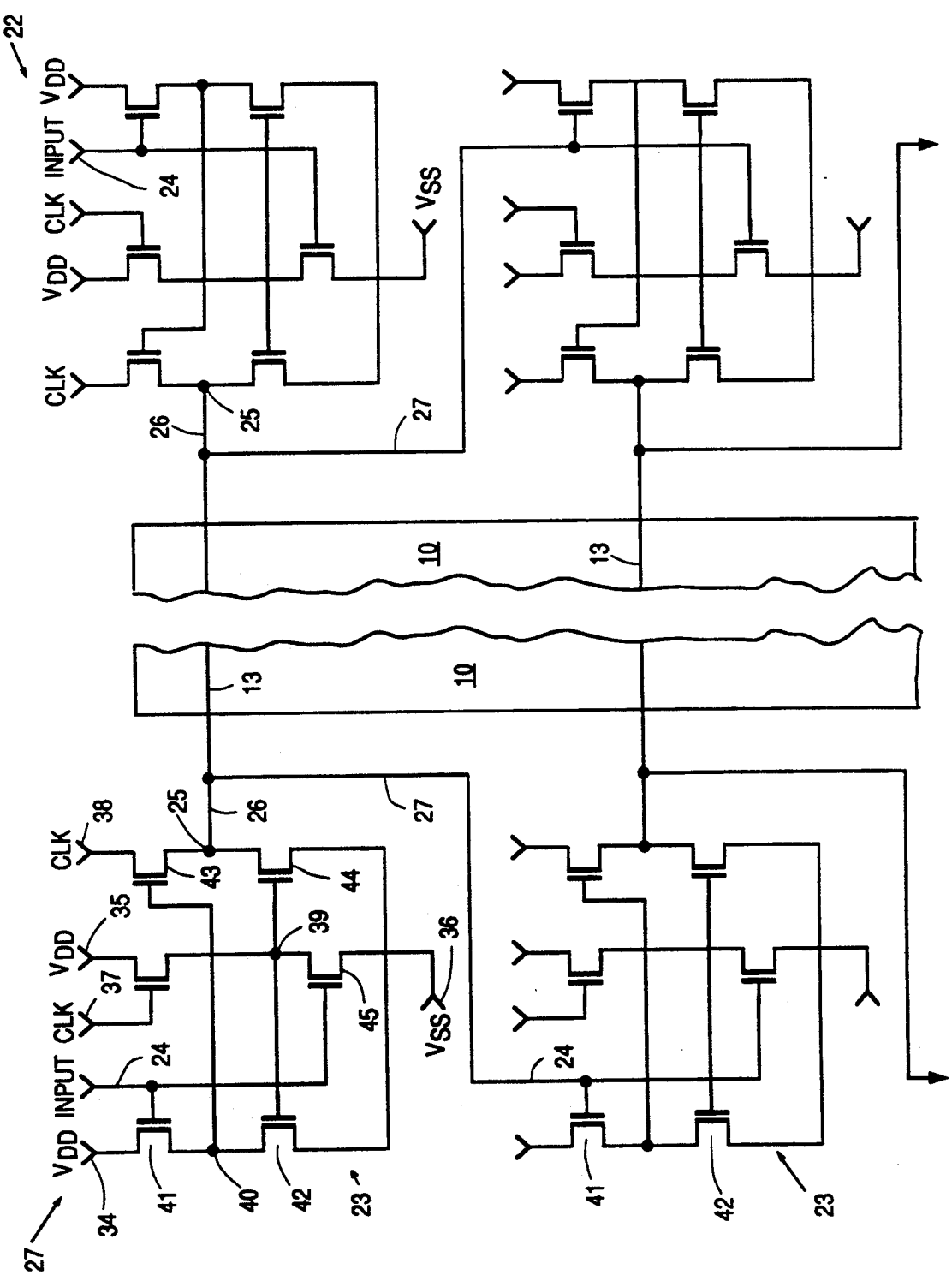

DESIGN AND TEST METHODOLOGY FOR REDUNDANT SHIFT REGISTERS

BACKGROUND

This invention relates generally to shift registers and particularly to redundant shift registers for scanned devices, such as liquid crystal displays (LCD's).

A liquid crystal display having redundant select line scanners (shift registers) is shown in FIG. 1 in simplified form. The display 10 includes an array of liquid crystal elements 11 arranged in rows and columns. Each liquid crystal element is associated with a switching device 12, such as a thin film transistor (TFT). The gate of each TFT 12 is connected to a select line 13 so that a complete row of TFT's is simultaneously biased by each select line 13. Substantially identical select line scanners 21 and 22 are connected to opposite ends of the select lines 13 by output terminals 17 and 18, respectively. The select line scanners provide the biasing voltages to the select lines. The drain of each TFT is connected to a data line 14 which provides a grey scale (brightness) signal to the liquid crystal element 11 associated with a conductive TFT 12. The data lines 14 are individually connected to the output terminals 15 of a data line scanner 16.

Select line scanners 21 and 22 are shift registers, each of which has a plurality of cascaded stages connected to opposite ends of each of the select lines 13. The brightness signals are simultaneously applied to all of the data lines 14 by data line scanner 16 so that all liquid crystal elements 11 associated with the biased select line are simultaneously charged to various voltages in accordance with the brightness signals received from data line scanner 16.

Liquid crystal displays for television and computer monitors have a large number of columns of liquid crystal cells, for example 1,440. A display with this number of columns and having the standard 3×4 aspect ratio would have approximately 1,080 select lines. Select line scanners 21 and 22 each would include 1,080 stages, and each stage includes 6 TFT's, for the example shown. Accordingly, there is a relatively high probability that at least one stage of one of the shift registers includes a flaw. The use of redundant registers allows a faulty stage of one register to be replaced by the corresponding stage of the other register. For this reason there is a need for a method of testing the redundant registers. There, therefore is also a need for a technique to electrically isolate the corresponding stages of the redundant registers during testing. The present invention fulfills these needs.

CROSS-REFERENCE TO RELATED APPLICATIONS

The present invention can be used with the invention described in application Ser. No. 660,272 filed concurrently herewith by Dora Plus and titled "Shift Register Useful As A Select Line Scanner For A Liquid Crystal Display".

The present invention can be used with the invention described in application Ser. No. 660,271 filed concurrently herewith by Dora Plus and titled "Shift Register, Particularly For A Liquid Crystal Display"

This application is related to the invention described in application Ser. No. 660,274 filed concurrently herewith by Antoine DuPont and Dora Plus and titled "Redundant Shift Registers For Scanning Devices".

SUMMARY

A method of laying out the stages of redundant select line scanners to enable the individual testing of the select line scanners, and to enable the electrical isolation of corresponding connected stages of the scanners includes the steps of providing separate power supplies and separate clock generators for each of the select line scanners. The scanners are separately tested by running one of the scanners in the usual manner while electrically isolating all other scanners from that being tested. Each scanner is sequentially tested by reversing the roles of the scanners until all scanners are tested.

BRIEF DESCRIPTION OF THE DRAWINGS

FIG. 2 is a schematic of a display (shown with the LCD array broken away) of the cascaded stages of redundant select line scanners, which can be tested using the inventive method

DETAILED DESCRIPTION

Figure 1:
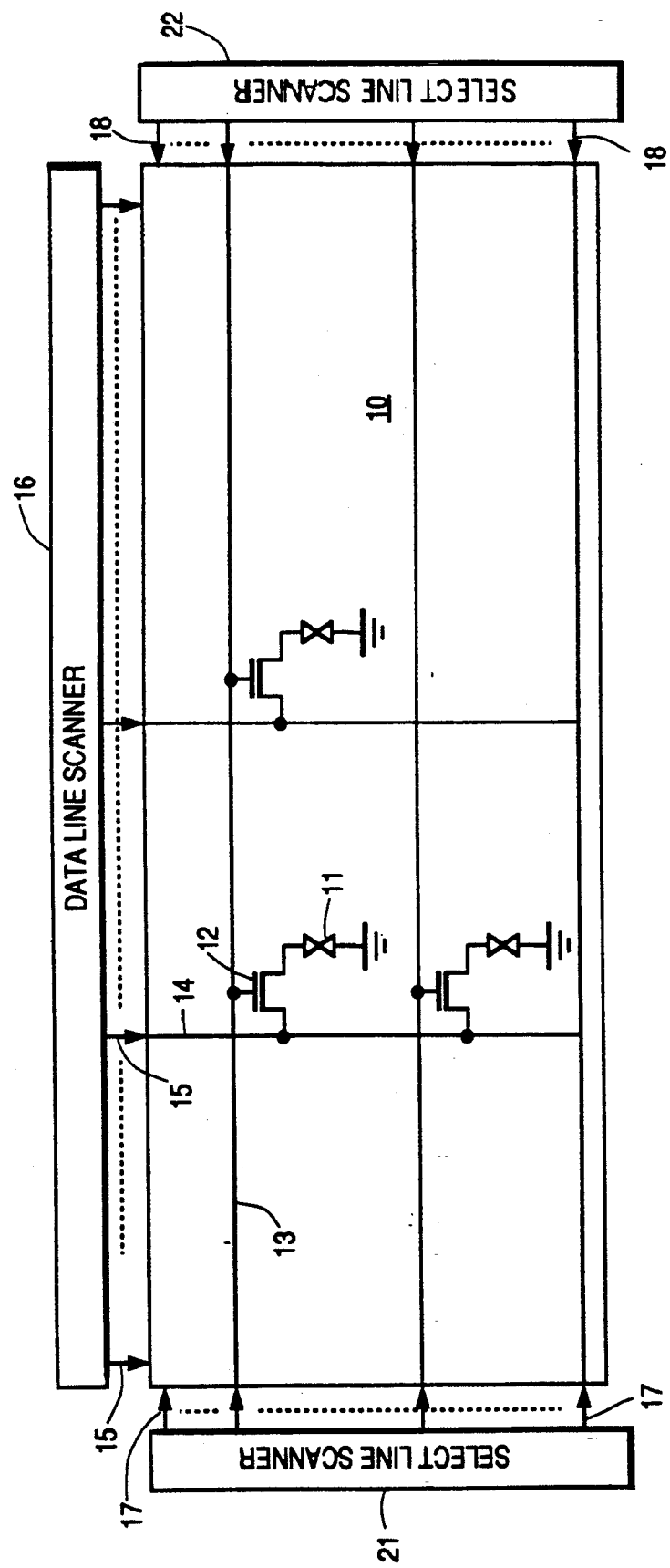
FIG. 1 is simplified representation of a liquid crystal display having redundant select line scanners.

In FIG. 2, the display panel 10 is shown broken away for convenience of illustration of the select line scanner stages. Redundant select line scanners 21 and 22 are comprised of a plurality of identical stages 23 each having an input terminal 24 and an output terminal 25. Each stage 23 also includes biasing terminals 34, 35, and 36, and clock terminals 37 and 38. The select line scanners 21 and 22 are provided with different power supplies and clock generators (not shown). Several significant advantages inure from the use of separate power supplies and clock generators for the two stages. One advantage is the ability to operate the scanners separately, this permits individual testing of the two scanners. Another significant advantage is the ability to electrically isolate corresponding stages of the two scanners without physically separating the stages. A disadvantage is the need for additional leads to the scanner. In LCD displays the reduction of lead count is an important consideration, and for this reason the use of separate power supplies and clock generators is a significant deviation from typical design techniques. However, the advantages gained from using separate power supplies and clock generators are sufficiently significant to warrant the increase. The exemplarily stages 23 shown in FIG. 2 are described in detail in copending application Ser. No. 660,272 fully referenced hereinabove.

The stages 23 of select line scanners 21 and 22 and the select lines 13 are ordinally numbered and correspondingly numbered stages are coupled to opposite ends of correspondingly numbered select lines 13 by separate line segments 26. The separate line segments 26 are also used to connect the output terminals 17 or 18 of the stages 23 within scanners 21 and 22 respectively, to the input terminals 24 of the immediately succeeding stage of the same scanner via lines 27. The output terminal of every stage is also connected to the input terminal of the succeeding stage of the other scanner by the separate line segment 26 with which it is associated, the associated select line 13 and the other line 27.

In operation, the select line scanners 21 and 22 are synchronously run and the production of an output pulse by one stage provides an input pulse to the immediately succeeding stage and also voltage biases the associated select line 13. A stage which is faulty for any reason can be isolated from the other stage simply by opening the separate line segment 26 of the faulty stage and the correspondingly numbered stage of the other scanner provides the input pulse to the succeeding stage of both scanners 21 and 22.

The scanners 21 and 22 are individually tested to identify faulty stages. Since the output terminals of the scanner stages are interconnected through the select lines, the stages must be electrically isolated during testing. An effective way to isolate the scanner stages is to cause the output terminal of the stage which is not being tested to exhibit a very high impedance to the stage being tested. A stage 23 will appear to have very high output impedance if nodes 39 and 40 are biased with a voltage having the polarity needed to turn the output devices of the stage off. The preferred embodiment uses n-type devices and therefore negative biasing voltages on nodes 39 and 40 are used for this purpose.

In accordance with the invention, the scanners 21 and 22 are provided with separate power supplies and clock generators. This permits the scanners 21 and 22 to be run separately. During the testing of one of the scanners 21 or 22, the clock terminals of the scanner not being tested are allowed to float. Also, terminals 34, 35, and 36 of the scanner not being tested are biased with a voltage which insures that TFT's 43 and 44 remain off. For the n-type devices used in the example a negative voltage, −20 volts for example, is used. Accordingly, when a stage of the scanner being tested produces an output pulse TFT's 41 and 45 of the immediately succeeding stage of the other scanner are turned on and nodes 39 and 40 are made negative by the biasing voltages. Stages which are identified as defective are permanently isolated from the display device by opening the separate line segment 26 of the defective stage. The stages of the untested scanner are then tested by reversing the roles of the two scanners.

It is possible for TFT 44 to include a source-to-drain short, which prevents the output line of the stage being tested from going high, the stage being tested then appears to be defective. The presence of a short in TFT 44 can be tested for by allowing terminal 36 to float and repeating the test. If the output line of the stage being tested goes high during the retest, TFT 44 is shorted, if it does not the stage being tested is defective. When TFT 44 is shorted the defective stage can be isolated from the display device by opening the separate line segment 26 of the defective stage and line 27 of the immediately preceding stage.

What is claimed is:

1. A method of isolating and testing cascaded stages of redundant select line scanners, the output terminals of corresponding stages of each of said select line scanners being connected by a separate line segment to the input terminal of the succeeding stage of both of said select line scanners, each of said stages having a plurality of biasing terminals and a plurality of clock terminals, comprising the steps of:

applying a voltage, having a polarity necessary to hold the output devices of said stage off, to said biasing terminals of a first of said select line scanners;

allowing said clock terminals of said first select line scanner to float;

testing the stages of a second of said select line scanners by operating said second select line scanner in the normal fashion;

applying a voltage, having a polarity necessary to hold the output devices of said stages off, to said biasing terminals of said second select line scanner;

allowing said clock terminals of said second shift register to float;

testing the stages of said first select line scanner by operating said first select line scanner in the normal fashion; and providing said first and second select line scanners with separate biasing voltages and separate clock signals.

2. A method of isolating and testing cascaded stages of redundant select line scanners, the output terminals of corresponding stages of each of said select line scanners being connected by a separate line segment to the input terminal of the succeeding stage of both of said select line scanners, each of said stages having a plurality of biasing terminals and a plurality of clock terminals, comprising the steps of:

testing a first of said select line scanners by operating said first select line scanner in the normal fashion;

applying a biasing voltage, having a polarity necessary to hold the output devices of said stages off, to said biasing terminals of the rest of said select line scanners;

allowing said clock terminals of the rest of said select line scanners to float; and successively testing the rest of said select line scanners in the same manner.

* * * * *